US012666848B2

(12) United States Patent
Lee et al.

(10) Patent No.: US 12,666,848 B2
(45) Date of Patent: Jun. 23, 2026

(54) DISPLAY APPARATUS

(71) Applicant: Samsung Display Co., Ltd., Yongin-si (KR)

(72) Inventors: Wonse Lee, Yongin-si (KR); Ilgoo Youn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 372 days.

(21) Appl. No.: 18/545,842

(22) Filed: Dec. 19, 2023

(65) Prior Publication Data

US 2024/0324407 A1 Sep. 26, 2024

(30) Foreign Application Priority Data

Mar. 24, 2023 (KR) ........................ 10-2023-0039232
Jun. 2, 2023 (KR) ........................ 10-2023-0071786

(51) Int. Cl.
| | |
|---|---|
| *H10K 59/80* | (2023.01) |
| *H10K 59/122* | (2023.01) |
| *H10K 59/124* | (2023.01) |
| *H10K 59/179* | (2023.01) |

(Continued)

(52) U.S. Cl.
CPC ......... *H10K 59/873* (2023.02); *H10K 59/122* (2023.02); *H10K 59/124* (2023.02); *H10K 59/179* (2023.02); *H10K 77/111* (2023.02); *H10K 2102/311* (2023.02); *H10K 2102/351* (2023.02)

(58) Field of Classification Search
CPC .. H10K 59/87; H10K 59/873; H10K 59/8731; H10K 59/124; H10K 77/111; H10K 77/10; H10K 2102/311; H10K 2102/301; H10K 2102/351; H10K 59/131; H10K 59/1275; H10K 50/8445
See application file for complete search history.

(56) References Cited

U.S. PATENT DOCUMENTS

| | | | |
|---|---|---|---|
| 11,706,945 | B2 | 7/2023 | Bang et al. |
| 2011/0272715 | A1 | 11/2011 | Kang et al. |
| 2020/0083306 | A1 | 3/2020 | Choi et al. |

(Continued)

FOREIGN PATENT DOCUMENTS

| | | |
|---|---|---|
| CN | 110880524 A | 3/2020 |
| EP | 3859810 A1 | 8/2021 |

(Continued)

*Primary Examiner* — Wasiul Haider
(74) *Attorney, Agent, or Firm* — Womble Bond Dickinson (US) LLP

(57) ABSTRACT

A display apparatus includes: a substrate comprising a display area and a peripheral area around the display area; a pixel circuit in the display area and a display device connected to the pixel circuit; a thin-film encapsulation layer covering the display device and comprising at least one inorganic film and at least one organic film; a first power supply line and a second power supply line in the peripheral area and spaced apart from each other; and a dam in the peripheral area and surrounding the display area, the dam comprising a first portion at least partially overlapping the first power supply line and a second portion at least partially overlapping the second power supply line, wherein the first portion and the second portion of the dam have different stacked structures from each other.

20 Claims, 12 Drawing Sheets

(51) Int. Cl.
  H10K 77/10       (2023.01)
  *H10K 102/00*       (2023.01)

(56)       References Cited

U.S. PATENT DOCUMENTS

2020/0381653 A1 *  12/2020  Bang ................... H10K 59/122
2021/0159301 A1      5/2021  Cho et al.
2022/0020833 A1 *   1/2022  Cho ...................... H10K 59/40

FOREIGN PATENT DOCUMENTS

KR      10-2018-0054386  A       5/2018
KR      10-2021-0131507  A      11/2021
KR      10-2022-0010690  A       1/2022

* cited by examiner

DISPLAY APPARATUS

CROSS-REFERENCE TO RELATED APPLICATION

The present application claims priority to and the benefit of Korean Patent Application No. 10-2023-0039232, filed on Mar. 24, 2023, and Korean Patent Application No. 10-2023-0071786, filed on Jun. 2, 2023, in the Korean Intellectual Property Office, the entire disclosure of each of which is incorporated herein by reference.

BACKGROUND

1. Field

Aspects of one or more embodiments relate to a display apparatus.

2. Description of Related Art

Display apparatuses visually display data. A display apparatus includes a substrate that is divided into a display area and a peripheral area outside the display area. In the display area, a scan line and a data line are insulated from each other, and a plurality of pixels connected to the scan line and the data line are arranged. Also, in the display area, a thin-film transistor corresponding to each of the pixels and a pixel electrode electrically connected to the thin-film transistor are provided. In the display area, a counter electrode commonly provided over the pixels is provided. In the peripheral area, various wirings for transmitting electrical signals to the display area, a scan driver, a data driver, and a controller may be provided.

Technology for sealing the display area to protect the display area of the display apparatus from moisture and/or external air has been actively studied.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus including a dam in a peripheral area.

Aspects of one or more embodiments relate to a display apparatus, and provide a display apparatus in which a dam is located in a peripheral area. However, the embodiments are examples, and do not limit the scope of embodiments according to the present disclosure.

Additional aspects will be set forth in part in the description which follows and, in part, will be apparent from the description, or may be learned by practice of the presented embodiments.

According to one or more embodiments, a display apparatus includes a substrate including a display area and a peripheral area around the display area, a pixel circuit located in the display area and a display device connected to the pixel circuit, a thin-film encapsulation layer covering the display device and including at least one inorganic film and at least one organic film, a first power supply line and a second power supply line located in the peripheral area to be spaced apart from each other, and a dam located in the peripheral area to surround the display area, the dam including a first portion at least partially overlapping the first power supply line and a second portion at least partially overlapping the second power supply line, wherein the first portion and the second portion of the dam have different stacked structures from each other.

According to some embodiments, the display apparatus may further include a first organic insulating layer and a second organic insulating layer stacked between the pixel circuit and the display device, wherein the first portion includes a 1-1$^{th}$ layer that is a lowermost layer and is formed of a same material as a material of the first organic insulating layer, and the second portion includes a 2-1$^{th}$ layer that is a lowermost layer and is formed of a same material as a material of the second organic insulating layer.

According to some embodiments, the first power supply line may be located over the 1-1$^{th}$ layer, and the second power supply line may be located under the 2-1$^{th}$ layer.

According to some embodiments, the first power supply line may be electrically connected to a counter electrode of the display device, and the second power supply line may be configured to transmit a driving voltage to the pixel circuit.

According to some embodiments, the display apparatus may further include a detection wiring located in the peripheral area of the substrate, and clad by the first portion of the dam.

According to some embodiments, the detection wiring may at least partially overlap the first power supply line.

According to some embodiments, the first portion of the dam may be provided by stacking a 1-1$^{th}$ layer, a 1-2$^{th}$ layer, and a 1-3$^{th}$ layer, which are formed of an organic material, and the second portion may be provided by stacking a 2-1$^{th}$ layer and a 2-2$^{th}$ layer, wherein the 1-2$^{th}$ layer and the 2-1$^{th}$ layer are integrally provided.

According to some embodiments, the 1-3$^{th}$ layer and the 2-2$^{th}$ layer may be integrally provided, and a thickness of the 2-2$^{th}$ layer may be greater than a thickness of the 1-3$^{th}$ layer.

According to some embodiments, the second portion may further include a 2-3$^{th}$ layer located on the 2-2$^{th}$ layer.

According to some embodiments, heights of the first portion and the second portion of the dam from a top surface of the substrate may be at a same level.

According to some embodiments, the display apparatus may further include an inner dam located between the dam and the display area and spaced apart from the dam, wherein a height of the inner dam is equal to or less than a height of the dam.

According to one or more embodiments, a display apparatus includes a substrate including a display area and a peripheral area around the display area, a pixel circuit located in the display area and a display device connected to the pixel circuit, a first organic insulating layer and a second organic insulating layer stacked between the pixel circuit and the display device, a wiring located between the first organic insulating layer and the second organic insulating layer, a pixel-defining film located on the second organic insulating layer, and configured to define an emission area of the display device, a thin-film encapsulation layer covering the display device and including at least one inorganic film and at least one organic film, a first power supply line and a second power supply line located in the peripheral area to be spaced apart from each other, a first dam located in the peripheral area to surround the display area, and a second dam located to surround the first dam, the second dam including a first portion at least partially overlapping the first power supply line and a second portion at least partially overlapping the second power supply line, wherein the first portion and the second portion of the second dam have different stacked structures from each other.

According to some embodiments, the first portion may include a 1-1$^{th}$ layer formed of a same material as a material of the first organic insulating layer and a 1-2$^{th}$ layer formed of a same material as a material of the second organic insulating layer.

According to some embodiments, a part of the first power supply line may be located between the 1-1$^{th}$ layer and the 1-2$^{th}$ layer.

According to some embodiments, the second portion may include a 2-1$^{th}$ layer that is a lowermost layer and is formed of a same material as a material of the second organic insulating layer.

According to some embodiments, the display apparatus may further include a detection wiring located in the peripheral area of the substrate and clad by the first portion of the second dam.

According to some embodiments, the first portion of the second dam may be provided by stacking a 1-1$^{th}$ layer, a 1-2$^{th}$ layer, and a 1-3$^{th}$ layer formed of an organic material, and the second portion may be provided by stacking a 2-1$^{th}$ layer and a 2-2$^{th}$ layer, wherein the 1-2$^{th}$ layer and the 2-1$^{th}$ layer are integrally provided.

According to some embodiments, the 1-3$^{th}$ layer and the 2-2$^{th}$ layer may be integrally provided, and a thickness of the 2-2$^{th}$ layer may be greater than a thickness of the 1-3$^{th}$ layer.

According to some embodiments, the peripheral area may include a bending area bent about a bending axis, an inorganic insulating layer located in the bending area may include a groove, and an organic insulating layer may be located in the groove.

According to some embodiments, the display area may have a circular shape.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
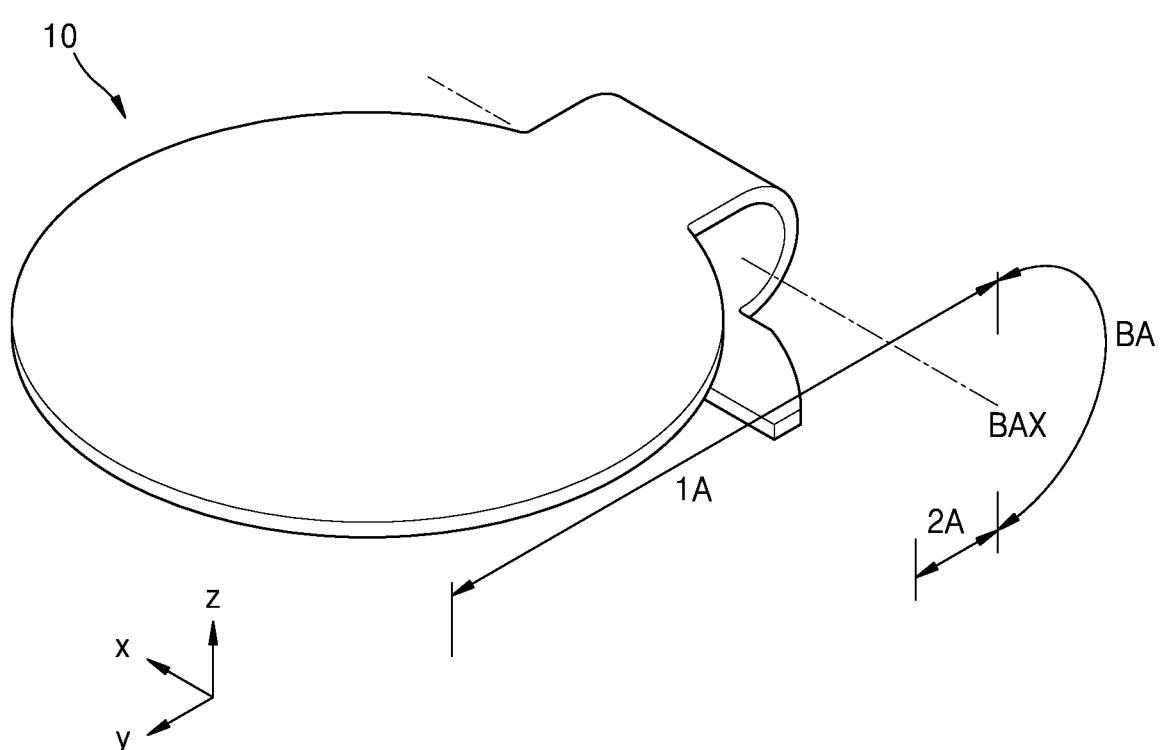
FIG. 1 is a perspective view illustrating a display apparatus, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any combination of a, b, and/or c.

As the disclosure allows for various changes and numerous embodiments, certain embodiments will be illustrated in the drawings and described in the detailed description. Effects and features of the disclosure, and methods for achieving them will be clarified with reference to embodiments described below in more detail with reference to the drawings. However, the disclosure is not limited to the following embodiments and may be embodied in various forms.

Hereinafter, aspects of some embodiments will be described in more detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," and "having," are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or reduced for convenience of explanation. For example, because sizes and thicknesses of elements in the drawings are arbitrarily illustrated for convenience of explanation, the disclosure is not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
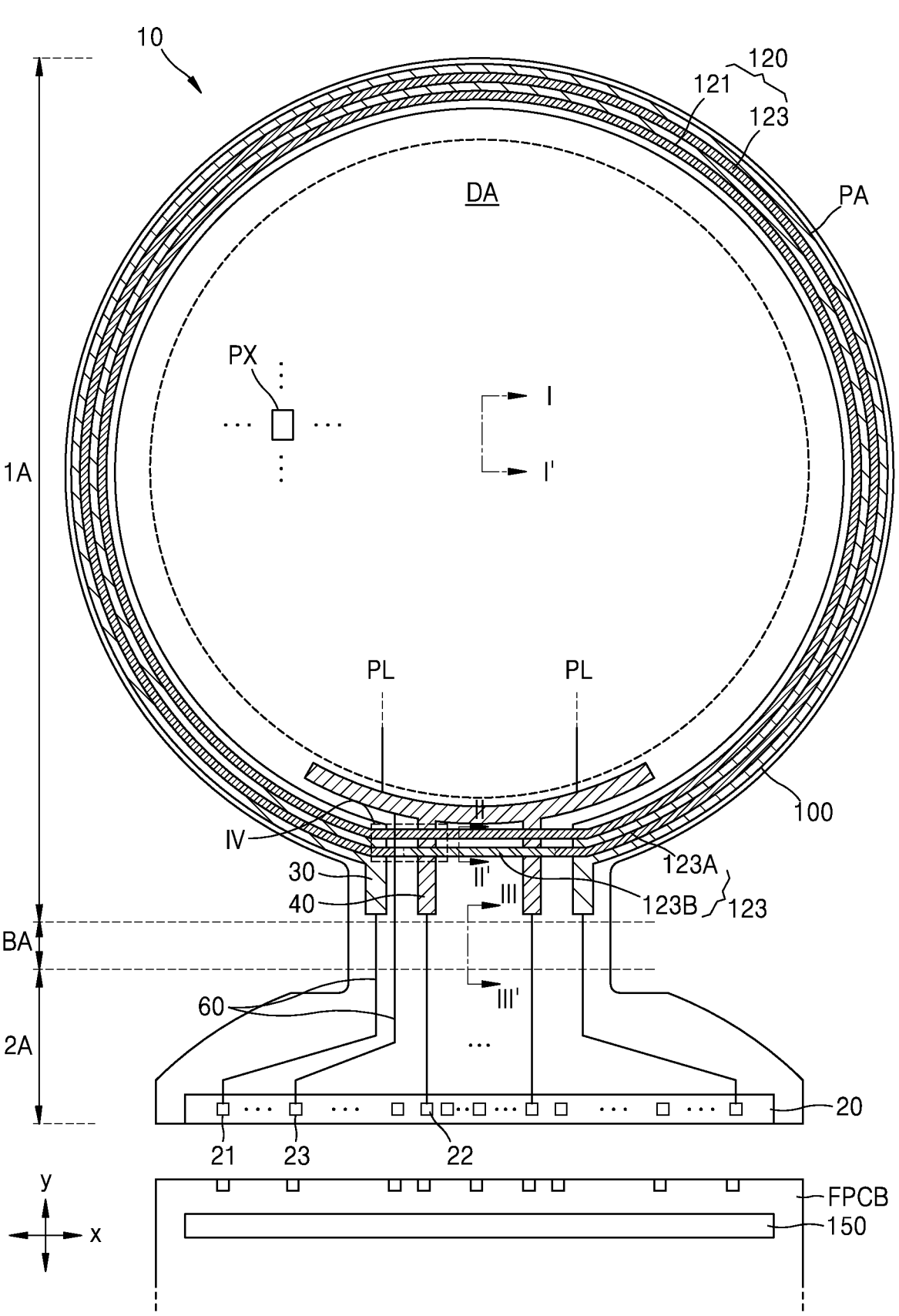
FIG. 2 is a plan view illustrating the display apparatus of FIG. 1, according to some embodiments.

FIG. 1 is a perspective view illustrating a display apparatus, according to some embodiments. FIG. 2 is a plan view illustrating the display apparatus of FIG. 1.

Referring to FIGS. 1 and 2, a display apparatus 10 may include a substrate 100. The substrate 100 may include a display area DA and a peripheral area PA that is a non-display area outside (e.g., in a periphery or outside a footprint of) the display area DA in a plan view. In this case, the substrate 100 may include a first area 1A, a second area 2A, and a bending area BA. In this case, the first area 1A may be a display portion, and the second area 2A may be a connecting portion connected to an external device. In this case, the display portion may display images according to an operation of the display area DA when the display area DA is exposed to the outside. The display area DA may be included in the first area 1A, and the peripheral area PA may include a part of the first area 1A excluding the display area DA, the second area 2A, and the bending area BA.

The first area 1A may have a non-quadrangular shape. The non-quadrangular shape may be, for example, a circular shape, an elliptical shape, a polygonal shape having a circular part, or a polygonal shape other than a quadrangular shape. Additionally, according to some embodiments, the first area 1A may have a quadrangular shape or a quadrangular shape with round corners.

The substrate 100 includes the bending area BA extending in a first direction (+x direction). The bending area BA is located between the first area 1A and the second area 2A, in a second direction (+y direction) that intersects the first direction. For example, the substrate 100 may be bent about a bending axis BAX extending in the first direction (+x direction) as shown in FIG. 1. Although the substrate 100 is bent with the same radius of curvature about the bending axis BAX in FIG. 1, embodiments according to the present disclosure are not limited thereto. The substrate 100 may be bent so that a radius of curvature is not constant about the bending axis BAX.

The substrate 100 may include any of various flexible or bendable materials. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a single or multi-layer structure including the above material, and when the substrate 100 has a multi-layer structure, the substrate 100 may further include an inorganic layer.

The first area 1A includes the display area DA. The first area 1A includes a part of the peripheral area PA outside the display area DA in addition to the display area DA as shown in FIG. 2. The second area 2A includes another part of the peripheral area PA.

The display area DA may have a shape corresponding to a shape of a part of the substrate 100. In FIG. 2, a part of the substrate 100 has a circular shape, and the display area DA has a circular shape corresponding to the shape of the part of the substrate 100.

A plurality of pixels PX are included in the display area DA, to display images. The plurality of pixels PX may be implemented by a display device, and the display device may be driven by a pixel circuit connected to the display device. The pixel circuit may include elements such as a thin-film transistor (TFT) and a storage capacitor. The pixel circuit may be connected to a scan line and a data line that intersects the scan line. Also, the pixel circuit may be connected to a driving voltage line PL.

Each pixel PX may emit, for example, red light, green light, blue light, or white light, and may include, for example, an organic light-emitting diode. The display area DA provides a certain image through light emitted from the pixels PX. The pixel PX used herein refers to a sub-pixel emitting light of any one of red, green, blue, and white as described above.

The peripheral area PA of the first area 1A is an area in which the pixels PX are not located, and does not display images. In the peripheral area PA, a first power supply line 30 and a second power supply line 40 for applying different power voltages may be located. Also, in the peripheral area PA, a scan driver may be located.

In the peripheral area PA, the first power supply line 30 may be arranged to surround at least a part of the display area DA. In the peripheral area PA, the first power supply line 30 may be located to surround most of the display area DA except for a portion in which the second power supply line 40 is located. In some embodiments, the first power supply line 30 may be arranged to surround a part of the second power supply line 40. The first power supply line 30 may be electrically connected to a counter electrode of display devices located in the display area DA to transmit a common voltage. The first power supply line 30 may be connected to a pad 21 of a pad unit 20. Because the first power supply line 30 is connected to the pad 21, the first power supply line 30 may include a portion extending to the pad unit 20, for example, a portion extending in a −y direction.

The second power supply line 40 may be located in the peripheral area PA to correspond to a lower end of the display area DA. A plurality of driving voltage lines PL for transmitting a driving voltage to a plurality of pixel circuits located in the display area DA may be connected to the second power supply line 40. The second power supply line 40 may be connected to a pad 22 of the pad unit 20. Because the second power supply line 40 is connected to the pad unit 20, the second power supply line 40 may include a portion extending to the pad unit 20, for example, a portion extending in the −y direction.

A scan driver may be located on a side of the display area DA in the peripheral area PA. For example, the scan driver may be located on a left side, a right side, or both sides of the display area DA. A scan signal generated from the scan driver may be provided to the pixels through the scan line.

In the peripheral area PA, a dam unit 120 at least partially surrounding the display area DA may be located. The dam unit 120 may protrude from the substrate 100 to block the flow of an organic material when an organic encapsulation layer of a thin-film encapsulation layer for sealing the display area DA is formed.

As described above, the dam unit 120 may continuously surround the display area DA. However, embodiments according to the present disclosure are not limited thereto. The dam unit 120 may partially surround the display area DA.

The dam unit 120 may at least partially overlap the first power supply line 30. A plurality of dam units 120 may be provided. For example, the dam unit 120 may include a first dam 121 located at an inner position and a second dam 123 surrounding the first dam 121. That is, the first dam 121 may be located closer to the display area DA than the second dam 123. Although the first dam 121 and the second dam 123 overlap the first power supply line 30 in FIG. 2, embodiments according to the present disclosure are not limited thereto. Various modifications may be made. For example, the first dam 121 may not overlap the first power supply line 30.

The second dam 123 may include a first portion 123A and a second portion 123B having different stacked structures. The first portion 123A may overlap the first power supply line 30, and the second portion 123B may overlap the second power supply line 40. Further details of the structure of the second dam 123 will be described below.

The pad unit 20 may be located in the second area 2A. The pad unit 20 includes a plurality of pads 21, 22, and 23. The pad unit 20 may be exposed without being covered by an insulating layer, and may be electrically connected to a controller such as a flexible printed circuit board (FPCB) or a driving driver 150.

The driving driver 150 may be located on a separate flexible printed circuit board FPCB, and the flexible printed circuit board FPCB may be connected to the pad unit 20. According to some embodiments, the driving driver 150 may be arranged in various locations and configurations. For example, the driving driver 150 may be directly located on an upper portion extending and protruding from the substrate 100 by using a chip-on-glass (COG) or chip-on-plastic (COP) method.

The controller converts a plurality of image signals transmitted from the outside into a plurality of image data signals, and transmits the changed signals to the display area DA through the pad unit 20. Also, the controller may receive a vertical synchronization signal, a horizontal synchronization signal, and a clock signal, may generate a control signal for controlling driving of the scan driver, and may transmit the control signal to the scan driver through the pad unit 20. The controller may apply different voltages to the first power supply line 30 and the second power supply line 40 through the pad unit 20. The pad unit 20 may be connected to a plurality of fan-out wirings 60, to transmit a voltage and various signals to the display area DA.

The plurality of fan-out wirings 60 may overlap the bending area BA. The fan-out wirings 60 may extend from the first area 1A through the bending area BA to the second area 2A. The fan-out wirings 60 may extend to intersect the bending axis BAX. The fan-out wirings 60 may be arranged in various ways. For example, the fan-out wirings 60 may perpendicularly cross the bending axis BAX, or may diagonally cross the bending axis BAX at a certain angle. Also, the fan-out wirings 60 may have any of various shapes such as a circular shape or a zigzag shape rather than a linear shape.

Figure 3:
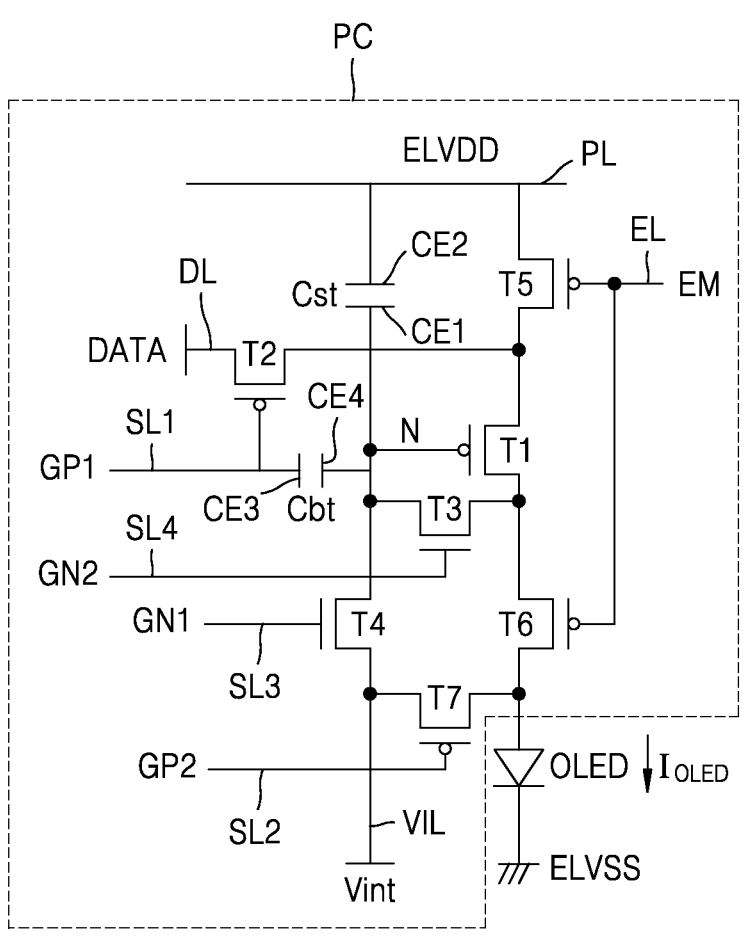
FIG. 3 is an equivalent circuit diagram illustrating a pixel circuit and a display device connected to the pixel circuit, according to some embodiments.

FIG. 3 is an equivalent circuit diagram illustrating a pixel circuit and a display device connected to the pixel circuit, according to some embodiments.

Referring to FIG. 3, a pixel circuit PC may include first to seventh transistors T1, T2, T3, T4, T5, T6, and T7, a first capacitor Cst, and a second capacitor Cbt. The pixel circuit PC may implement a pixel by driving an organic light-emitting diode OLED that is a display device. Additionally, according to some embodiments, the pixel circuit PC may include additional components or fewer components without departing from the spirit and scope of embodiments according to the present disclosure.

A plurality of signal lines (e.g., SL1, SL2, SL3, SL4, EL, and DL), an initialization voltage line VIL, and a driving voltage line PL may be connected to the pixel circuit PC. At least one of signal lines (e.g., SL11, SL12, SL21, SL22, EL, or DL), the initialization voltage line VIL, and/or the driving voltage line PL may be shared by neighboring pixel circuits. The first to seventh transistors T1 to T7 may be implemented as thin-film transistors. In FIG. 3, the third transistor T3 and the fourth transistor T4 from among the first to seventh transistors T1 to T7 may be implemented as n-channel MOSFETs (NMOSs) and the rest may be implemented as p-channel MOSFETs (PMOSs).

The signal lines may include a plurality of data lines DL, a plurality of first scan lines SL1, a plurality of second scan lines SL2, a plurality of third scan lines SL3, a plurality of fourth scan lines SL4, and a plurality of emission control lines EL. The second scan line SL2 may be connected to the first scan line SL1, and a first scan signal GP1 may be a second scan signal GP2.

The driving voltage line PL transmits a driving voltage ELVDD to the first transistor T1, and the initialization voltage line VIL transmits an initialization voltage Vint for initializing the first transistor T1 and the organic light-emitting diode OLED to the organic light-emitting diode OLED.

The first transistor T1 is connected to the driving voltage line PL via the fifth transistor T5, and is electrically connected to the organic light-emitting diode OLED via the sixth transistor T6. The first transistor T1 functions as a driving transistor, and receives a data signal DATA and supplies driving current $I_{OLED}$ to the organic light-emitting diode OLED according to a switching operation of the second transistor T2.

The second transistor T2 is connected to the first scan line SL1 and the data line DL, and is connected to the driving voltage line PL via the fifth transistor T5. The second transistor T2 is turned on according to the first scan signal GP1 received through the first scan line SL1, and performs a switching operation of transmitting the data signal DATA received through the data line DL to a node N.

The third transistor T3 is connected to the fourth scan line SL4, and is connected to the organic light-emitting diode OLED via the sixth transistor T6. The third transistor T3 is turned on according to a fourth scan signal GN2 received through the fourth scan line SL4, and diode-connects the first transistor T1.

The fourth transistor T4 is connected to the third scan line SL3 and the initialization voltage line VIL, and is turned on according to a third scan signal GN1 received through the third scan line SL3, to transmit the initialization voltage Vint from the initialization voltage line VIL to a gate electrode of the first transistor T1 and initialize a voltage of the gate electrode of the first transistor T1. The initialization voltage Vint may be different from a voltage applied to the gate electrode of the first transistor T1.

The fifth transistor T5 and the sixth transistor T6 are connected to the emission control line EL, and are simultaneously or concurrently turned on according to an emission control signal EM received through the emission control line EL, to form a current path through which the driving current $I_{OLED}$ may flow from the driving voltage line PL to the organic light-emitting diode OLED. The emission control signal EM may be different according to a color of a pixel. Also, the emission control signal EM may have a value different from the initialization voltage Vint.

The seventh transistor T7 is connected to the second scan line SL2 and the initialization voltage line VIL, and is turned on according to the second scan signal GP2 received through the second scan line SL2, to transmit the initialization voltage Vint from the initialization voltage line VIL to the organic light-emitting diode OLED and initialize the organic light-emitting diode OLED. The seventh transistor T7 may be omitted.

The first capacitor Cst includes a first electrode CE1 and a second electrode CE2. The first electrode CE1 is connected to the gate electrode of the first transistor T1, and the second electrode CE2 is connected to the driving voltage line PL. The first capacitor Cst may maintain a voltage applied to the gate electrode of the first transistor T1 by storing and maintaining a voltage corresponding to a difference between voltages of both ends of the gate electrode of the first transistor T1 and the driving voltage line PL. The first capacitor Cst may be a storage capacitor.

The second capacitor Cbt includes a third electrode CE3 and a fourth electrode CE4. The third electrode CE3 is connected to the first scan line SL1 and a gate electrode of the second transistor T2. The fourth electrode CE4 is connected to the gate electrode of the first transistor T1 and the first electrode CE1 of the first capacitor Cst. The second capacitor Cbt is a boosting capacitor, and when the first scan signal GP1 of the first scan line SL1 is a voltage for turning off the second transistor T2, the second capacitor Cbt may reduce a voltage displaying black (black voltage) by increasing a voltage of the node N. The second capacitor Cbt may be a booster capacitor. The second capacitor Cbt may be omitted.

The organic light-emitting diode OLED may include a pixel electrode and a counter electrode, and the counter electrode may receive a common voltage ELVSS. The organic light-emitting diode OLED displays an image by receiving the driving current $I_{OLED}$ from the first transistor T1 and emitting light.

A specific operation of each pixel circuit PC according to some embodiments is as follows.

During an initialization period, when the third scan signal GN1 is supplied through the third scan line SL3, the fourth transistor T4 is turned on in response to the third scan signal GN1, and the first transistor T1 is initialized by the initialization voltage Vint supplied from the initialization voltage line VIL.

During a data programming period, when the first scan signal GP1, the second scan signal GP2, and the fourth scan signal GN2 are respectively supplied through the first scan line SL1, the second scan line SL2, and the fourth scan line SL4, the second transistor T2, the seventh transistor T7, and the third transistor T3 are turned on in response to the first scan signal GP1, the second scan signal GP2, and the fourth scan signal GN2. In this case, the first transistor T1 is diode-connected by 1 the turned-on third transistor T3, and is forward biased. Next, a voltage obtained by compensating for a threshold voltage Vth of the first transistor T1 from the data signal DATA supplied from the data line DL is applied to the gate electrode of the first transistor T1. The organic light-emitting diode OLED is initialized by the initialization voltage Vint supplied from the initialization voltage line VIL by the turned-on seventh transistor T7. The driving voltage ELVDD and a compensation voltage are applied to both ends of the first capacitor Cst, and a charge corresponding to a voltage difference between both ends is stored in the first capacitor Cst.

During a light emission period, the fifth transistor T5 and the sixth transistor T6 are turned on by the emission control signal EM supplied from the emission control line EL. The driving current $I_{OLED}$ is generated according to a voltage difference between a voltage of the gate electrode of the first transistor T1 and the driving voltage ELVDD, and the driving current $I_{OLED}$ is supplied to the organic light-emitting diode OLED through the sixth transistor T6.

According to some embodiments, at least one of the plurality of transistors (e.g., T1 to T7) includes a semiconductor layer including an oxide, and the rest includes a semiconductor layer including silicon. For example, because the first transistor that directly affects the brightness of a display apparatus may include a semiconductor layer formed of polycrystalline silicon having high reliability, a high-resolution display apparatus may be realized.

Because an oxide semiconductor has high carrier mobility and low leakage current, voltage drop is not large even when a driving time is long. That is, because a color change in an image due to voltage drop is not large even during low frequency driving, low frequency driving is possible. As such, because an oxide semiconductor has small leakage current, when at least one of the third transistor T3 or the fourth transistor T4 connected to the gate electrode of the first transistor T1 includes an oxide semiconductor, leakage current that may flow to the gate electrode of the first transistor T1 may be prevented or reduced and power consumption may be relatively reduced.

Figure 4:
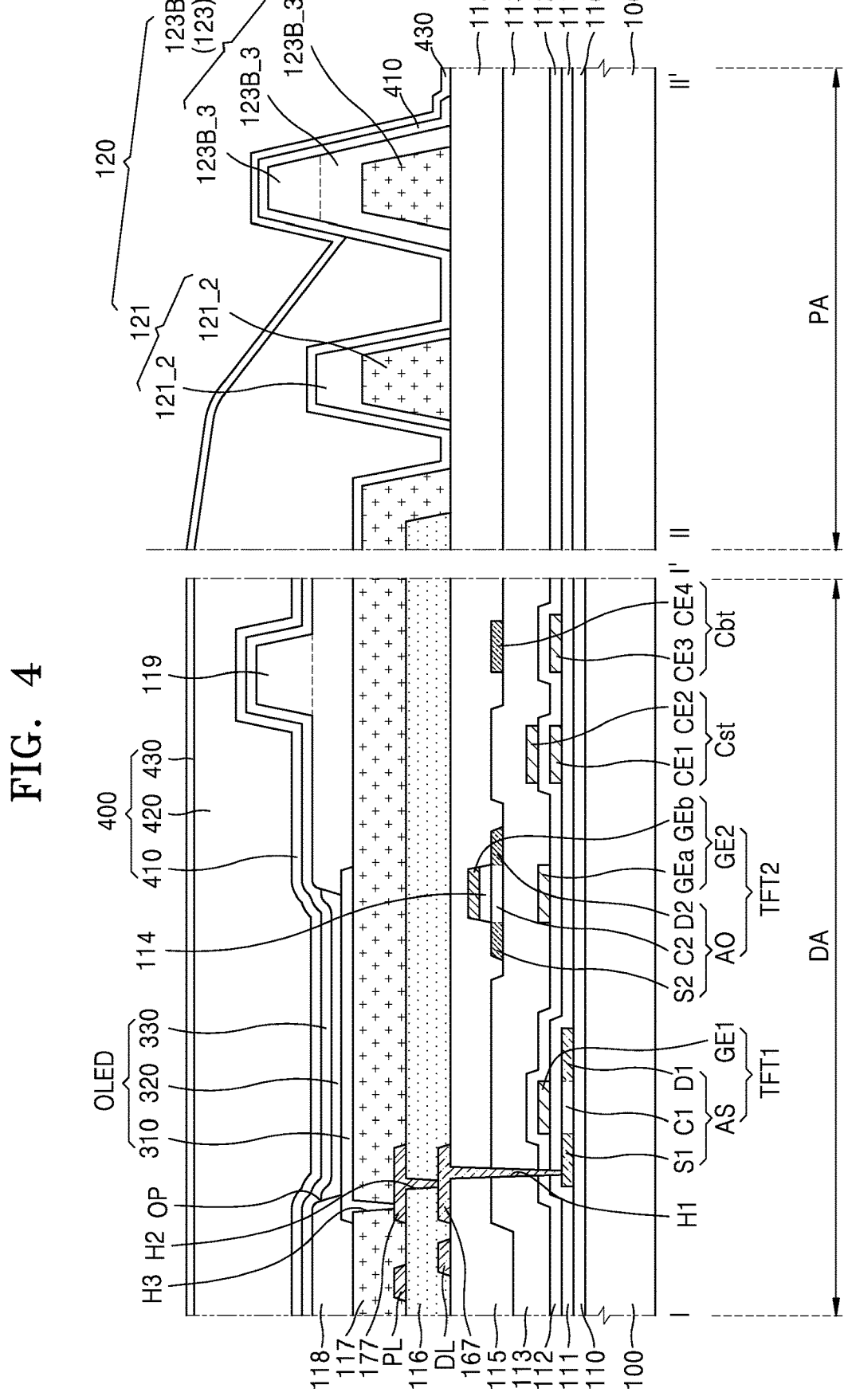
FIG. 4 is a schematic cross-sectional view taken along the lines I-I' and II-II' of FIG. 2, according to some embodiments.
Figure 5:
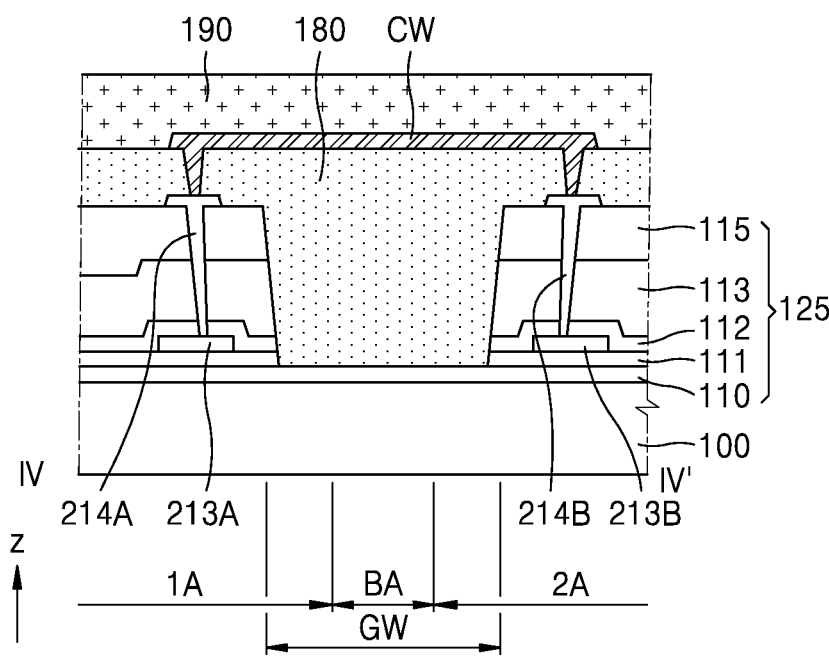
FIG. 5 is a schematic cross-sectional view taken along the line III-III' of FIG. 2, according to some embodiments.

FIG. 4 is a schematic cross-sectional view taken along the lines I-I' and II-II' of FIG. 2. FIG. 5 is a schematic cross-sectional view taken along the line III-III' of FIG. 2.

Referring to FIG. 4, a display apparatus may include the substrate 100, a first thin-film transistor TFT1 including a silicon semiconductor, a second thin-film transistor TFT2 including an oxide semiconductor, the first capacitor Cst, and the second capacitor Cbt. The first thin-film transistor TFT1 may be the first transistor T1, the second transistor T2, the fifth transistor T5, the sixth transistor T6, or the seventh transistor T7 of FIG. 3. The second thin-film transistor TFT2 may be the third transistor T3 or the fourth transistor T4 of FIG. 3. Also, the display apparatus may include the organic light-emitting diode OLED as a display device and a thin-film encapsulation layer 400 that seals the organic light-emitting diode OLED.

The substrate 100 may include a glass material, a ceramic material, a metal material, or a flexible or bendable material. When the substrate 100 is flexible or bendable, the substrate 100 may include a polymer resin. The substrate 100 may have a single or multi-layer structure including the above material, and when the substrate 100 has a multi-layer structure, the substrate 100 may further include an inorganic layer. In some embodiments, the substrate 100 may have a structure including an organic material, an inorganic material, and an organic material.

A buffer layer 110 may planarize a top surface of the substrate 100, and may include an oxide film such as silicon oxide ($SiO_x$), and/or a nitride film such as silicon nitride ($SiN_x$), or silicon oxynitride (SiON).

A barrier layer may be further provided between the substrate 100 and the buffer layer 110. The barrier layer may prevent, reduce, or minimize impurities or contaminants from the substrate 100 or the like from penetrating into a silicon semiconductor layer. The barrier layer may include an inorganic material such as oxide or nitride and/or an organic material, and may have a single or multi-layer structure including an inorganic material and an organic material.

A first semiconductor layer AS of the first thin-film transistor TFT1 including a silicon oxide may be located on the buffer layer 110. The first semiconductor layer AS may include a source region S1 and a drain region D1 doped with impurities to have conductivity and spaced apart from each other, and a channel region C1 located between the source region S1 and the drain region D1. The source region S1 and the drain region D1 may respectively correspond to a source electrode and a drain electrode of the first thin-film transistor TFT1, and positions of the source region S1 and the drain region D1 may be exchanged.

A gate electrode GE1 of the first thin-film transistor TFT1 may be located on the first semiconductor layer AS, and a first insulating layer 111 may be located between the first semiconductor layer AS and the gate electrode GE1.

The first insulating layer 111 may include an inorganic material including oxide or nitride. For example, the first insulating layer 111 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), or hafnium oxide ($HfO_2$).

The gate electrode GE1 of the first thin-film transistor TFT1 may overlap the channel region C1 of the first semiconductor layer AS, and may include at least one of molybdenum (Mo), copper (Cu), titanium (Ti), or aluminum (Al). In this case, the gate electrode GE1 may have a single or multi-layer structure including at least one of the above materials.

The first electrode CE1 of the first capacitor Cst and a third electrode CE3 of the second capacitor Cbt may be located on the same layer as the gate electrode GE1 of the first thin-film transistor TFT1.

A second insulating layer 112 may be located on the gate electrode GE1 of the first thin-film transistor TFT1, the first electrode CE1 of the first capacitor Cst, and the third electrode CE3 of the second capacitor Cbt.

The second insulating layer 112 may include an inorganic material including oxide or nitride. For example, the second insulating layer 112 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), or hafnium oxide ($HfO_2$).

The second electrode CE2 of the first capacitor Cst may be located on the second insulating layer 112 to overlap the first electrode CE1 of the first capacitor Cst. The second electrode CE2 may include at least one of molybdenum (Mo), copper (Cu), or titanium (Ti). The second electrode CE2 may have a single or multi-layer structure including at least one of the above materials.

A third insulating layer 113 may be located on the second electrode CE2 of the first capacitor Cst. The third insulating layer 113 may include an inorganic material such as oxide or nitride. For example, the third insulating layer 113 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), or hafnium oxide ($HfO_2$).

Although the first capacitor Cst is spaced apart from the first thin-film transistor TFT1 in FIG. 4, according to some embodiments, the first capacitor Cst may overlap the first thin-film transistor TFT1. For example, the second electrode CE2 may be located on the gate electrode GE1 of the first thin-film transistor TFT1 to overlap the gate electrode GE1. In this case, the gate electrode GE1 of the first thin-film transistor TFT1 may function not only as a gate electrode but also as the first electrode CE1 of the first capacitor Cst.

A second semiconductor layer AO of the second thin-film transistor TFT2 including an oxide semiconductor may be located on the third insulating layer 113. The second semiconductor layer AO may include a source region S2 and a drain region D2 having conductivity and spaced apart from each other, and a channel region C2 located between the source region S2 and the drain region D2. The oxide semiconductor may include a Zn oxide-based material such as Zn oxide, In—Zn oxide, or Ga—In—Zn oxide. For example, the second semiconductor layer AO may be formed of an In—Ga—Zn—O (IGZO), In—Sn—Zn—O (ITZO), or In—Ga—Sn—Zn—O (IGTZO) semiconductor containing a metal such as indium (In), gallium (Ga), or tin (Sn) in ZnO. The source region S2 and the drain region D2 of the second semiconductor layer AO may be formed by adjusting a carrier concentration of an oxide semiconductor to make the oxide semiconductor conductive. For example, the source region S2 and the drain region D2 may be formed by increasing a carrier concentration through plasma treatment using a hydrogen (H)-based gas, a fluorine (F)-based gas, or a combination thereof on an oxide semiconductor.

A first gate electrode GEa may be located under the second semiconductor layer AO of the second thin-film transistor TFT2, and a second gate electrode GEb may be located over the second semiconductor layer AO of the second thin-film transistor TFT2. That is, the second thin-film transistor TFT2 may include a dual gate electrode. The third insulating layer 113 may be located between the first gate electrode GEa of the second thin-film transistor TFT2 and the second semiconductor layer AO. The first gate electrode GEa of the second thin-film transistor TFT2 and the second electrode CE2 of the first capacitor Cst may be formed on the same layer by using the same material. At least the channel region C2 of the second semiconductor layer AO may overlap the first gate electrode GEa of the second thin-film transistor TFT2.

A fourth insulating layer 114 may be located between the second semiconductor layer AO and the second gate electrode GEb of the second thin-film transistor TFT2. The second gate electrode GEb may overlap the channel region C2 of the second semiconductor layer AO. The fourth insulating layer 114 may be formed through the same mask process as the second gate electrode GEb, and in this case, the fourth insulating layer 114 may be formed in the same shape as the second gate electrode GEb.

The fourth insulating layer 114 may include an inorganic material such as oxide or nitride. For example, the fourth insulating layer 114 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), or hafnium oxide ($HfO_2$), or zinc oxide ($ZnO_2$). The second gate electrode GEb may include at least one of molybdenum (Mo), copper (Cu), titanium (Ti), or aluminum (Al). In this case, the second gate electrode GEb may have a single or multi-layer structure including at least one of the above materials.

The fourth electrode CE4 of the second capacitor Cbt may be located on the third insulating layer 113 to overlap the third electrode CE3. The fourth electrode CE4 of the second capacitor Cbt may include an oxide semiconductor. According to some embodiments, the fourth electrode CE4 of the second capacitor Cbt may extend from the second semiconductor layer AO of the second thin-film transistor TFT2 and overlap the third electrode CE3. The second insulating layer 112 and the third insulating layer 113 may be located between the third electrode CE3 and the fourth electrode CE4.

A fifth insulating layer 115 may cover the second thin-film transistor TFT2. The fifth insulating layer 115 may be located on the second gate electrode GEb, and the data line DL and a first connection electrode 167 may be located on the fifth insulating layer 115.

The fifth insulating layer 115 may include an inorganic material including oxide or nitride. For example, the fifth insulating layer 115 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), or hafnium oxide ($HfO_2$), or zinc oxide ($ZnO_2$).

Each of the data line DL and the first connection electrode 167 may be formed of a material having high conductivity such as a metal or a conductive oxide. For example, each of the data line DL and the first connection electrode 167 may have a single or multi-layer structure including at least one of aluminum (Al), copper (Cu), or titanium (Ti). In some embodiments, each of the data line DL and the first connection electrode 167 may have a three layer structure in which titanium, aluminum, and titanium (Ti/Al/Ti) are sequentially arranged.

The first connection electrode 167 may be connected to the first semiconductor layer AS through a contact hole H1. The contact hole H1 may pass through the first insulating layer 111, the second insulating layer 112, the third insulating layer 113, and the fifth insulating layer 115, and may expose a part of the first semiconductor layer AS. A part of the first connection electrode 167 may be inserted into the contact hole H1 to be electrically connected to the first semiconductor layer AS.

A first organic insulating layer 116 that is a planarization layer may be located on the data line DL and the first connection electrode 167. The first organic insulating layer 116 may include an organic material such as acryl, benzocyclobutene (BCB), polyimide, or hexamethyldisiloxane (HMDSO). The first organic insulating layer 116 may function as a protective film covering the first thin-film transistor TFT1 and the second thin-film transistor TFT2, and a top surface of the first organic insulating layer 116 may be flat. The first organic insulating layer 116 may have a single or multi-layer structure.

The driving voltage line PL and a second connection electrode 177 may be located on the first organic insulating layer 116. The driving voltage line PL may partially overlap the data line DL. The second connection electrode 177 may be connected to the first connection electrode 167 through a contact hole H2 defined in the first organic insulating layer 116. Each of the driving voltage line PL and the second connection electrode 177 may be formed of a conductive material such as a metal or a conductive oxide. For example, each of the driving voltage line PL and the second connection electrode 177 may have a single or multi-layer structure including at least one of aluminum (Al), copper (Cu), or titanium (Ti). A second organic insulating layer 117 may be located on the driving voltage line PL and the second connection electrode 177.

The organic light-emitting diode OLED may be located on the second organic insulating layer 117. The organic insulating layer OLED may include a pixel electrode 310, a counter electrode 330, and an intermediate layer 320 located between the pixel electrode 310 and the counter electrode 330 and including an emission layer.

The pixel electrode 310 may be connected to the second connection electrode 177 through the contact hole H2 defined in the second organic insulating layer 117, and may be connected to the first thin-film transistor TFT1 by the second connection electrode 177 and the first connection electrode 167.

A pixel-defining film 118 may be located on the second organic insulating layer 117. The pixel-defining film 118 may define a pixel by having an opening OP corresponding to each pixel, that is, an opening through which a part of the pixel electrode 310 is exposed. Also, the pixel-defining film 118 increases a distance between an edge of the pixel electrode 310 and the counter electrode 330 over the pixel electrode 310 to prevent or reduce instances of an arc or the like occurring at the edge of the pixel electrode 310. The pixel-defining film 118 may be formed of an organic material such as polyimide or hexamethyldisiloxane (HMDSO).

The pixel electrode 310 may be located on the second organic insulating layer 117, and may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 310 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the pixel electrode 310 may further include a film formed of ITO, IZO, ZnO, or $In_2O_3$ over/under the reflective film.

The intermediate layer 320 of the organic light-emitting diode OLED includes an emission layer. The emission layer may include a high molecular weight organic material or a low molecular weight organic material that emits light of a certain color. The emission layer may be a red emission layer, a green emission layer, or a blue emission layer. Alternatively, the emission layer may have a multi-layer structure in which a red emission layer, a green emission layer, and a blue emission layer are stacked to emit white light, or a single-layer structure including a red light-emitting material, a green light-emitting material, and a blue light-emitting material. According to some embodiments, the intermediate layer 320 may include a first functional layer located under the emission layer and/or a second functional layer located over the emission layer. The first functional layer and/or the second functional layer may include a layer that is integrally formed over a plurality of pixel electrodes 310, or may include a layer that is patterned to correspond to each of the plurality of pixel electrodes 310.

The first functional layer may have a single or multi-layer structure. For example, when the first functional layer is formed of a high molecular weight material, the first functional layer may include a hole transport layer (HTL) having a single-layer structure and may be formed of poly-(3,4)-ethylene-dihydroxythiophene (PEDOT) or polyaniline (PANI). When the first functional layer is formed of a low molecular weight material, the first functional layer may include a hole injection layer (HIL) and an HTL.

The second functional layer is not always provided. For example, when the first functional layer and the emission layer are formed of a high molecular weight material, some embodiments may form the second functional layer in order to improve the characteristics of the organic light-emitting diode OLED. The second functional layer may have a single or multi-layer structure. The second functional layer may include an electron transport layer (ETL) and/or an electron injection layer (EIL).

The counter electrode 330 faces the pixel electrode 310 with the intermediate layer 320 therebetween. The counter electrode 330 may be formed of a conductive material having a low work function. For example, the counter electrode 330 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 330 may further include a layer such as ITO, IZO, ZnO, or $In_2O_3$ on the (semi-)transparent layer including the above material. The counter electrode 330 may be located on the intermediate layer 320 and the pixel-defining film 118. The counter electrode 330 may be a common electrode that is integrally formed over a plurality of organic light-emitting diodes OLED in the display area DA and faces a plurality of pixel electrodes 310.

Also, a spacer 119 for preventing or reducing mask damage may be further provided on the pixel-defining film 118. The spacer 119 may be formed of an organic material such as polyimide or hexamethyldisiloxane (HMDSO). The spacer 119 may be formed of the same material as that of the pixel-defining film 118. The pixel-defining film 118 and the spacer 119 may be simultaneously (or concurrently) formed in the same process. In this case, in a mask for forming the pixel-defining film 118 and the spacer 119, a portion corresponding to the pixel-defining film 118 may be formed using a halftone mask and a portion corresponding to the spacer may be formed using a full tone mask, so that the pixel-defining film 118 and the spacer 119 have different thicknesses.

Because the organic light-emitting diodes OLED may be easily damaged by external moisture or oxygen, the thin-film encapsulation layer 400 may cover and protect the organic light-emitting diodes OLED. The thin-film encapsulation layer 400 may cover the display area DA and may extend to the outside of the display area DA. The thin-film encapsulation layer 400 may include a first inorganic encapsulation layer 410, an organic encapsulation layer 420, and a second inorganic encapsulation layer 430 as shown in FIG. 4.

The first inorganic encapsulation layer 410 may cover the counter electrode 330, and may include silicon oxide, silicon nitride, and/or silicon oxynitride. When necessary, other layers such as a capping layer may be located between the first inorganic encapsulation layer 410 and the counter electrode 330. Because the first inorganic encapsulation layer 410 is formed along a lower structure, a top surface of the first inorganic encapsulation layer 410 is not flat as shown in FIG. 4. The organic encapsulation layer 420 covers the first inorganic encapsulation layer 410, and unlike the first inorganic encapsulation layer 410, the organic encapsulation layer 420 may have a substantially flat top surface. For example, a portion of the organic encapsulation layer 420 corresponding to the display area DA may have a substantially flat top surface. The organic encapsulation layer 420 may include at least one material selected from the group consisting of polyethylene terephthalate, polyethylene naphthalate, polycarbonate, polyimide, polyethylene sulfonate, polyoxymethylene, polyarylate, and hexamethyl-disiloxane. The second inorganic encapsulation layer 430 may cover the organic encapsulation layer 420, and may include silicon oxide, silicon nitride, and/or silicon oxynitride. The second inorganic encapsulation layer 430 may prevent or reduce instances of the organic encapsulation layer 420 being exposed to the outside, by contacting the first inorganic encapsulation layer 410 at an edge located outside the display area DA.

As such, because the thin-film encapsulation layer 400 includes the first inorganic encapsulation layer 410, the organic encapsulation layer 420, and the second inorganic encapsulation layer 430, even when cracks occur in the thin-film encapsulation layer 400, due to the multi-layer structure, the cracks may not be connected between the first inorganic encapsulation layer 410 and the organic encapsulation layer 420 or between the organic encapsulation layer 420 and the second inorganic encapsulation layer 430. Accordingly, the formation of a path through which external moisture or oxygen penetrates into the display area DA may be prevented, reduced, or minimized.

A color filter or a polarization plate for reducing external light reflection may be further located on the thin-film encapsulation layer 400.

The dam unit 120 is located in the peripheral area PA of the display apparatus, according to some embodiments. The dam unit 120 may include the first dam 121 located at an inner position and the second dam 123 located outside the first dam 121. FIG. 4 illustrates a cross-section of the second portion 123B of the second dam 123.

The dam unit 120 may include an additional dam in addition to the first dam 121 and the second dam 123. For example, the dam unit 120 may further include a dam located at an inner position than the first dam 121 and/or a dam located outside the second dam 123. According to some embodiments, the first dam 121 of the dam unit 120 may be omitted, and only the second dam 123 may be located.

The dam unit 120 may prevent or reduce instances of an organic material flowing to an edge of the substrate 100 and forming an edge tail of the organic encapsulation layer 420 when the organic encapsulation layer 420 of the thin-film encapsulation layer 400 for sealing the display area DA and the peripheral area PA is formed.

The first dam 121 may be spaced apart from the first organic insulating layer and the second organic insulating layer 117 extending from the display area DA. The first dam 121 may be provided by stacking a first layer 121_1 formed of the same material as that of the second organic insulating layer 117 and a second layer 121_2 formed of the same material as that of the pixel-defining film 118.

The second dam 123 may be located outside the first dam 121 to be spaced apart from the first dam 121. The second portion 123B of the second dam 123 may be provided by stacking a 2-1$^{th}$ layer 123B_1 formed of the same material as that of the second organic insulating layer 117, a 2-2$^{th}$ layer 123B_2 formed of the same material as that of the pixel-defining film 118, and a 2-3$^{th}$ layer 123B_3 formed of the same material as that of the spacer 119.

Because the pixel-defining film 118 and the spacer 119 may be simultaneously (or concurrently) formed by using the same material, in this case, the second dam 123 may have a two-layer structure.

The second dam 123 may have a height that is equal to or greater than that of the first dam 121. Accordingly, an edge tail of the organic encapsulation layer 420 of the thin-film encapsulation layer 400 may be effectively prevented or reduced.

Although the organic encapsulation layer 420 of the thin-film encapsulation layer 400 is located between the first dam 121 and the second dam 123 in FIG. 4, the disclosure is not limited thereto. The organic encapsulation layer 420 of the thin-film encapsulation layer 400 may be located only inside the first dam 121 and may not be located between the first dam 121 and the second dam 123.

The first inorganic encapsulation layer 410 and the second inorganic encapsulation layer 430 of the thin-film encapsulation layer 400 may contact each other at an upper end of the second dam 123 and outside the second dam 123. Also, the first inorganic encapsulation layer 410 and the second inorganic encapsulation layer 430 may contact the fifth insulating layer 115 that is an inorganic insulating layer outside the second dam 123. Accordingly, penetration of external air into the display area Da may be prevented or reduced.

FIG. 5 schematically illustrates elements located near the bending area BA.

The buffer layer 110 and the first insulating layer 111 to the fifth insulating layer 115 including an inorganic material may be collectively referred to as an inorganic insulating layer 125. The inorganic insulating layer 125 may include at least one of the first insulating layer 111 to the fifth insulating layer 115. In this case, the following will be described assuming that the inorganic insulating layer 125 does not include the fourth insulating layer 114. The inorganic insulating layer 125 includes a groove corresponding to the bending area BA as shown in FIG. 5.

The groove may be a portion remaining after removing a part of the inorganic insulating layer 125 in a downward direction (−z direction). For example, the buffer layer 110 may be continuous over the first area 1A, the bending area BA, and the second area 2A. The inorganic insulating layer 125 may have an opening corresponding to the bending area BA. Accordingly, the inorganic insulating layer 125 may include a groove corresponding to the bending area BA. The inorganic insulating layer 125 may include a groove having a different shape. Various modifications may be made. For example, a part of a top surface of the buffer layer 110 (in a +z direction) may also be removed, or a bottom surface of the first insulating layer 111 (in the −z direction) may remain without being removed.

When the groove corresponds to the bending area BA, it may mean that the groove overlaps the bending area BA. In this case, the area of the groove may be greater than the area of the bending area BA. To this end, in FIG. 5, a width GW of the groove is greater than a width of the bending area BA. The area of the groove may be defined as the area of a narrowest opening from among openings of the inorganic insulating layer 125.

In the display apparatus according to some embodiments, an organic layer 180 may fill at least a part of the groove. That is, the organic layer 180 overlaps the bending area BA. The organic layer 180 may extend to a part of a non-bending area. The organic layer 180 and the first organic insulating layer 116 located in the display area DA may be formed of the same material in the same process. A connection wiring CW may be located on the organic layer 180. The connection wiring CW extends from the first area 1A through the bending area BA to the second area 2A, and is located on the organic layer 180. The connection wiring CW may be located on the inorganic insulating layer 125 at a position where the organic layer 180 is not located. The connection wiring CW may constitute a part of the fan-out wiring 60 (see FIG. 2).

According to this structure, because transmission of stress that may occur during bending to the connection wiring CW may be minimized, the risk of defects such as disconnection of the connection wiring CW may be reduced.

The connection wiring CW may be electrically connected to conductive layers 213A and 213B located in the first area 1A and the second area 2A. The conductive layers 213A and 213B may be located on a layer different from a layer on which the connection wiring CW is located. In some embodiments, the conductive layers 213A and 213B may be located on the same layer using the same material as the gate electrode 213 of the thin-film transistor 210.

The connection wiring CW may be connected to a third connection electrode 214A located on the fifth insulating layer 115, and the third connection electrode 214A may contact the conductive layers 213A and 213B through contact holes formed in the second insulating layer 112, the third insulating layer 113, and the fifth insulating layer 115.

The connection wiring CW may be connected to the conductive layer 213B of the second area 2A through a fourth connection electrode 214B. In this case, the fourth connection electrode 214B and the third connection electrode 214A may be formed through the same process.

In addition, the conductive layer 213A may be located in the first area 1A, and the conductive layer 213B may be located in the second area 2A. In this case, positions of the conductive layers 213A and 213B are not limited thereto, and the conductive layers 213A and 213B may be located on a top surface of any one layer of the inorganic insulating layer 125.

The conductive layer 213A located in the first area 1A may be electrically connected to a thin-film transistor in the display area DA, and thus, the connection wiring CW may be electrically connected to the thin-film transistor in the display area DA through the conductive layer 213A.

An upper organic layer 190 may be located on the connection wiring CW. The upper organic layer 190 may be formed of the same material as that of the second organic insulating layer 117. The upper organic layer 190 may protect the connection wiring CW.

A stress neutralization layer (SNL) may be located on the upper organic layer 190. That is, the SNL may be located on the connection wiring CW to correspond to the bending area BA. A stress neutral plane of the SNL may be located near the connection wiring CW, thereby minimizing stress applied to the connection wiring CW.

The connection wiring CW may be formed of the same material as that of wirings located on the first organic insulating layer 116, for example, the driving voltage line PL. The connection wiring CW may have a single or multi-layer structure including at least one of aluminum (Al), copper (Cu), or titanium (Ti).

Figure 6:
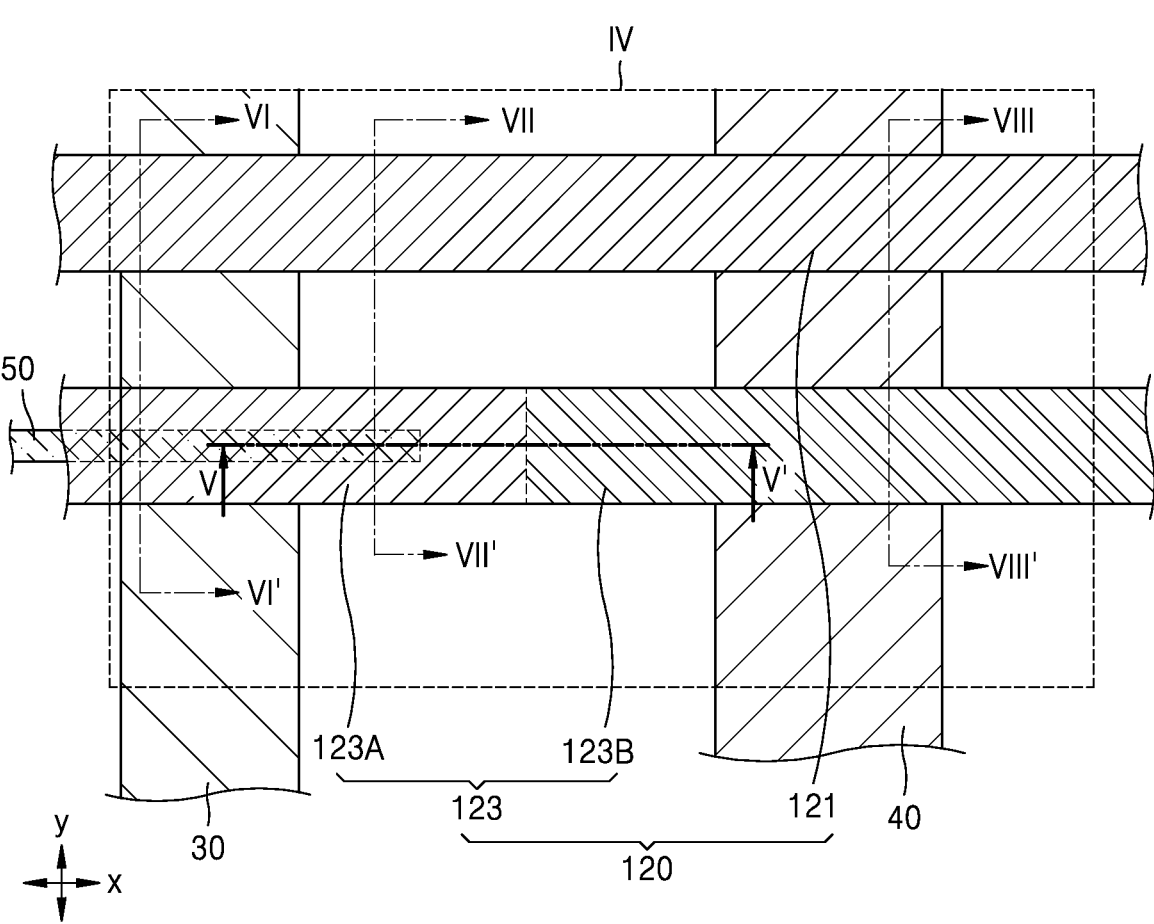
FIG. 6 is an enlarged view illustrating a portion VI of FIG. 2, according to some embodiments.
Figure 7A:
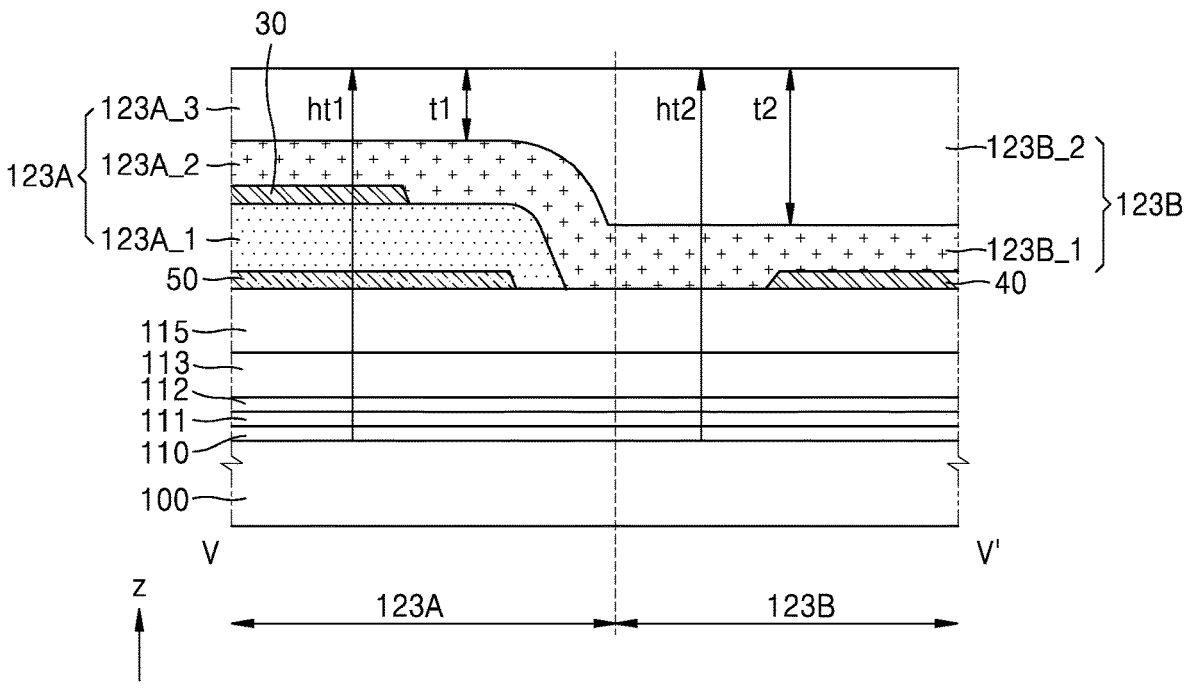
FIG. 7A is a cross-sectional view taken along the line V-V' of FIG. 6, according to some embodiments.
Figure 7B:
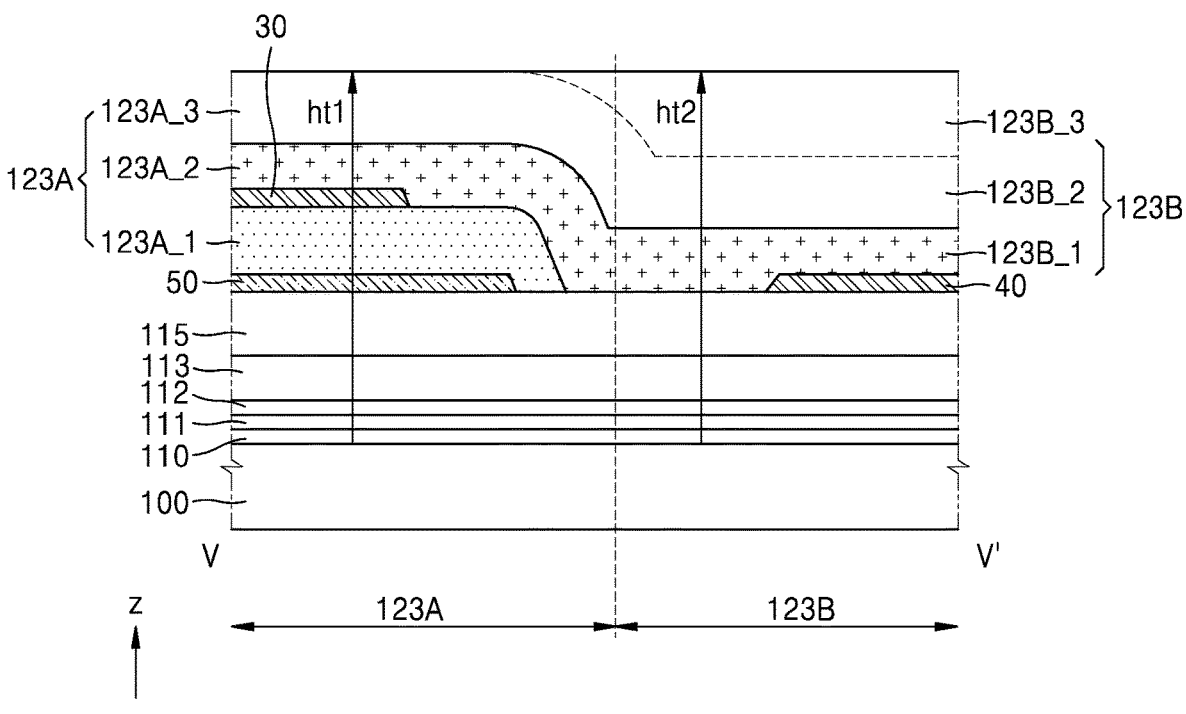
FIG. 7B is a cross-sectional view taken along the line V-V' of FIG. 6, according to some embodiments.

FIG. 6 is an enlarged view illustrating a portion VI of FIG. 2. FIGS. 7A and 7B are cross-sectional views taken along the line V-V' of FIG. 6.

Referring to FIG. 6, the display apparatus includes the first power supply line 30 and the second power supply line 40 that are located in the peripheral area PA to be spaced apart from each other, and the dam unit 120 overlaps the first power supply line 30 and the second power supply line 40.

Parts of the first power supply line 30 and the second power supply line 40 may extend in the y direction, and the dam unit 120 may cross the first power supply line 30 and the second power supply line in the x direction that intersects the y direction.

The first power supply line 30 and the second power supply line 40 may be wirings that transmit different voltages. The first power supply line 30 may be a wiring that transmits the common voltage ELVSS (see FIG. 3) to a counter electrode of a display device. The second power supply line 40 may be a wiring that transmits the driving voltage ELVDD (see FIG. 3) to a pixel circuit.

According to some embodiments, the second dam 123 may include the first portion 123A at least partially overlapping the first power supply line 30 and the second portion 123B at least partially overlapping the second power supply line 40, and in this case, the first portion 123A and the second portion 123B of the second dam 123 may have different stacked structures.

Referring to FIG. 7A, the first portion 123A of the second dam 123 may be provided by stacking a 1-1$^{th}$ layer 123A_1 formed of the same material as that of the first organic insulating layer 116 (see FIG. 2), a 1-2$^{th}$ layer 123A_2 formed of the same material as that of the second organic insulating layer 117 (see FIG. 2), and a 1-3$^{th}$ layer 123A_3 formed of the same material as that of the pixel-defining film 118.

The second portion 123B of the second dam 123 may be provided by stacking the 2-1$^{th}$ layer 123B_1 formed of the same material as that of the second organic insulating layer 117 (see FIG. 2) and the 2-2$^{th}$ layer 123B_2 formed of the same material as that of the pixel-defining film 118.

According to some embodiments, the 1-1$^{th}$ layer 123A_1 that is a lowermost layer of the first portion 123A may be formed only on the first portion 123A and is removed from the second portion 123B. When the 1-1$^{th}$ layer 123A_1 is continuously located in the first portion 123A and the second portion 123B, the first power supply line 30 and the second power supply line 40 are located on the same layer, i.e., the 1-1$^{th}$ layer 123A_1. In this case, when the first power supply line 30 and the second power supply line 40 are formed by using etching or the like, a residual film may remain along an edge of the 1-1$^{th}$ layer 123A_1 of the second dam 123, thereby resulting in a short in which the first power supply line 30 is connected to the second power supply line 40.

According to embodiments, however, because the 1-1$^{th}$ layer 123A_1 is removed without being continuously located in the second portion 123B, a residual film that may remain on an edge of the 1-1$^{th}$ layer 123A_1 is removed, thereby preventing or reducing instances of a short in which the first power supply line 30 is connected to the second power supply line 40.

That is, the first power supply line 30 may be located on the 1-1$^{th}$ layer 123A_1 of the first portion 123A of the second dam 123, and the second power supply line 40 may be located under the 2-1$^{th}$ layer 123B_1 of the second portion 123B of the second dam 123. The first power supply line 30 and the second power supply line 40 overlapping the second dam 123 may be located on different layers.

The 1-3$^{th}$ layer 123A_3 of the first portion 123A of the second dam 123 and the 2-2$^{th}$ layer 123B_2 of the second portion 123B may be integrally provided. In this case, a thickness t2 of the 2-2$^{th}$ layer 123B_2 may be greater than a thickness t1 of the 1-3$^{th}$ layer 123A_3. To this end, a mask for forming the first portion 123A may be provided as a halftone mask, and a mask for forming the second portion 123B may be provided as a full tone mask, and the 1-3$^{th}$ layer 123A_3 and the 2-2$^{th}$ layer 123B_2 may be simultaneously (or concurrently) formed.

This may be to adjust a height ht1 of the first portion 123A from a top surface of the substrate 100 to the same level as a height ht2 of the second portion 123B from the top surface of the substrate 100. This may be to uniformly control the flow of the organic encapsulation layer 420 by adjusting a height of the second dam 123 to a constant level.

Referring to FIG. 7B, the second portion 123B of the second dam 123 may be provided by stacking the 2-1$^{th}$ layer 123B_1 formed of the same material as that of the second organic insulating layer 117 (see FIG. 2), the 2-2$^{th}$ layer 123B_2 formed of the same material as that of the pixel-defining film 118, and the 2-3$^{th}$ layer 123B_3 formed of the same material as that of the spacer 119. This may be to, when a height to the 2-2$^{th}$ layer 123B_2 of the second portion 123B is different from the height ht1 of the first portion 123A, adjust the height ht1 of the first portion 123A from the top surface of the substrate 100 to the same level as a height ht2 of the second portion 123B from the top surface of the substrate 100 by introducing the 2-3$^{th}$ layer 123B_3.

The display apparatus according to some embodiments may include a detection wiring 50 overlapping a part of the second dam 123. The detection wiring 50 may overlap the first portion 123A of the second dam 123 and may not overlap the second portion 123B of the second dam 123.

The detection wiring 50 and wirings located on the fifth insulating layer 115, for example, the data line DL, may be formed of the same material on the same layer. The detection wiring 50 may be used to detect cracks of the display apparatus. The detection wiring 50 may detect cracks of the display apparatus by measuring a change in resistance of the detection wiring 50.

The detection wiring 50 may not be exposed to the outside by being clad by the first portion 123A of the second dam 123. The detection wiring 50 may be clad by the 1-1$^{th}$ layer 123A_1 of the first portion 123A.

Figure 8:
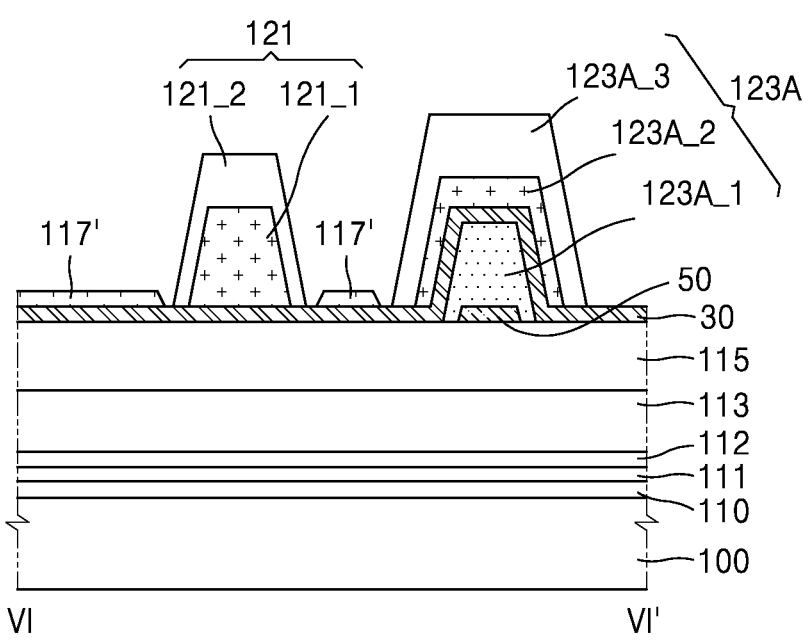
FIG. 8 is a schematic cross-sectional view taken along the line VI-VI' of FIG. 6, according to some embodiments.
Figure 9:
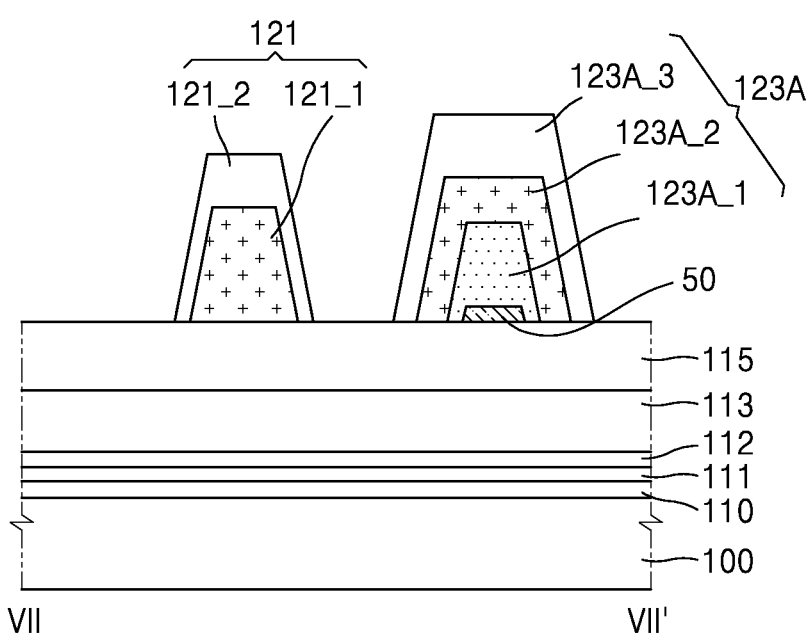
FIG. 9 is a schematic cross-sectional view taken along the line VII-VII' of FIG. 6, according to some embodiments.
Figure 10:
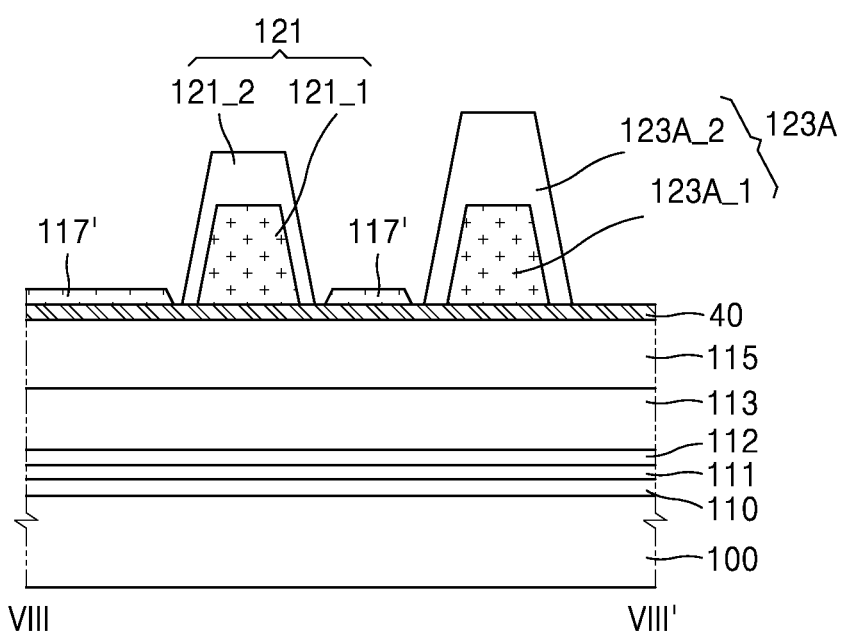
FIG. 10 is a schematic cross-sectional view taken along the line VIII-VIII' of FIG. 6, according to some embodiments.

FIGS. 8 to 10 are schematic cross-sectional views respectively taken along the lines VI-VI', VII-VII', and VIII-VIII' of FIG. 6.

Referring to FIG. 8, the first dam 121 and the first portion 123A of the second dam 123 may overlap the first power supply line 30.

The first dam 121 may be located over the first power supply line 30. The first dam 121 may include the first layer 121_1 formed of the same material as that of the second organic insulating layer 117 and the second layer 121_2 located on the first layer 121_1. The second layer 121_2 and the pixel-defining film 118 may be simultaneously (or concurrently) formed by using the same material. The second layer 121_2 may cover not only a top surface of the first layer 121_1 but also a side surface of the first layer 121_1.

The first portion 123A of the second dam 123 may be provided by stacking the 1-1$^{th}$ layer 123A_1 formed of the same material as that of the first organic insulating layer 116, the 1-2$^{th}$ layer 123A_2 formed of the same material as that of the second organic insulating layer 117, and the 1_3$^{th}$ layer 123A_3 formed of the same material as that of the pixel-defining film 118. The detection wiring 50 may be located under the 1-1$^{th}$ layer 123A_1 of the first portion 123A of the second dam 123, and the first power supply line 30 may be located between the 1-1$^{th}$ layer 123A_1 and the 1-2$^{th}$ layer 123A_2.

The first power supply line 30 and the detection wiring 50 may at least partially overlap each other. The first power supply line 30 and the detection wiring 50 may be spaced apart from each other by an insulating layer. That is, the 1-1$^{th}$ layer 123A_1 of the first portion 123A of the second dam 123 may be located between the first power supply line 30 and the detection wiring 50.

A protective layer 117' may be located on a portion of the first power supply line 30 exposed by the first dam 121 or the second dam 123. The protective layer 117' and the second organic insulating layer 117 may be simultaneously (or concurrently) formed by using the same material. The protective layer 117' may be formed to have a thickness less than a thickness of the second organic insulating layer 117 by using a halftone mask process. The protective layer 117' may prevent or reduce damage to the first power supply line 30 in a subsequent process.

Referring to FIG. 9, the first dam 121 and the second dam 123 are formed in direct contact with an insulating layer at a position not overlapping the first power supply line 30 or the second power supply line 40. That is, the first dam 121 and the first portion 123A of the second dam 123 may directly contact the fifth insulating layer 115.

The first dam 121 may be formed by stacking the first layer 121_1 and the second layer 121_2, and the first portion 123A of the second dam 123 may be formed by stacking the 1-1$^{th}$ layer 123A_1, the 1-2$^{th}$ layer 123A_2, and the 1-3$^{th}$ layer 123A_3. The first portion 123A of the second dam 123 may clad the detection wiring 50.

Referring to FIG. 10, the first dam 121 and the second portion 123B of the second dam 123 may overlap the second power supply line 40. The first dam 121 and the second portion 123B of the second dam 123 may be located on the second power supply line 40.

The first dam 121 may be provided by stacking the first layer 121_1 and the second layer 121_2. The second portion 123B of the second dam 123 may be provided by stacking the 2-1$^{th}$ layer 123B_1 formed of the same material as that of the second organic insulating layer 117 and the 2-2$^{th}$ layer 123B_2 formed of the same material as that of the pixel-defining film 118. The protective layer 117' may be located on a portion of the second power supply line 40 exposed by the first dam 121 or the second dam 123.

Figure 11:
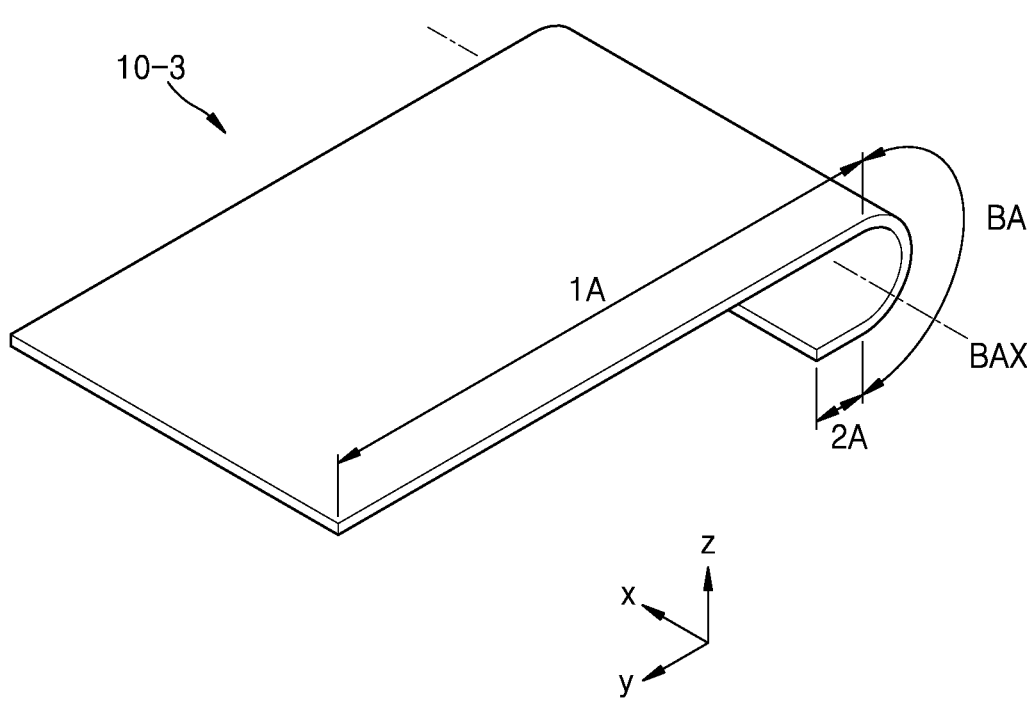
FIG. 11 is a perspective view illustrating a display apparatus, according to some embodiments.

FIG. 11 is a perspective view illustrating a display apparatus, according to some embodiments. A display apparatus 10-3 may be similar to one described with reference to at least one of FIGS. 1 to 10. For convenience of explanation, a difference from the description of at least one of FIGS. 1 to 10 will be mainly described in more detail. The substrate 100 provided in the display apparatus 10-3 may include the first area 1A, the second area 2A, and the bending area BA. In this case, the substrate 100 may have a rectangular shape.

In the above case, the substrate 100 may be bent about the bending axis BAX in the bending area BA as shown in FIG. 11.

In the first area 1A, the display area DA and the peripheral area PA may be located. In this case, the display area may have a quadrangular shape. For example, the display area may have a rectangular shape.

The display apparatus may include a dam surrounding the display area having a rectangular shape. In this case, the display apparatus may include a dam including a first portion at least partially overlapping a first power supply line and a second portion at least partially overlapping a second power supply line in the peripheral area, and the first portion and the second portion of the dam may have different stacked structures. According to this structure, a short that may occur between the power supply line and the second power supply line may be prevented or reduced.

As described above, because a display apparatus according to embodiments includes a dam including a first portion and a second portion having different stacked structures, the reliability of the display apparatus may be relatively improved. It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display apparatus comprising:
   a substrate comprising a display area and a peripheral area around the display area;
   a pixel circuit in the display area and a display device connected to the pixel circuit;
   a thin-film encapsulation layer covering the display device and comprising at least one inorganic film and at least one organic film;
   a first power supply line and a second power supply line in the peripheral area and spaced apart from each other; and
   a dam in the peripheral area and surrounding the display area, the dam comprising a first portion at least partially overlapping the first power supply line and a second portion at least partially overlapping the second power supply line,
   wherein the first portion and the second portion of the dam have different stacked structures from each other.

2. The display apparatus of claim 1, further comprising a first organic insulating layer and a second organic insulating layer stacked between the pixel circuit and the display device,
   wherein the first portion comprises a 1-1$^{th}$ layer that is a lowermost layer and is formed of a same material as a material of the first organic insulating layer, and the second portion comprises a 2-1$^{th}$ layer that is a lowermost layer and is formed of a same material as a material of the second organic insulating layer.

3. The display apparatus of claim 2, wherein the first power supply line is located over the 1-1$^{th}$ layer, and the second power supply line is located under the 2-1$^{th}$ layer.

4. The display apparatus of claim 2, wherein
   the first power supply line is electrically connected to a counter electrode of the display device, and
   the second power supply line is configured to transmit a driving voltage to the pixel circuit.

5. The display apparatus of claim 1, further comprising a detection wiring in the peripheral area of the substrate, and clad by the first portion of the dam.

6. The display apparatus of claim 5, wherein the detection wiring at least partially overlaps the first power supply line.

7. The display apparatus of claim 1, wherein the first portion of the dam is provided by stacking a 1-1$^{th}$ layer, a 1-2$^{th}$ layer, and a 1-3$^{th}$ layer, which are formed of an organic material, and the second portion is provided by stacking a 2-1$^{th}$ layer and a 2-2$^{th}$ layer,
   wherein the 1-2$^{th}$ layer and the 2-1$^{th}$ layer are integrally provided.

8. The display apparatus of claim 7, wherein the 1-3$^{th}$ layer and the 2-2$^{th}$ layer are integrally provided, and a thickness of the 2-2$^{th}$ layer is greater than a thickness of the 1-3$^{th}$ layer.

9. The display apparatus of claim 7, wherein the second portion further comprises a 2-3$^{th}$ layer on the 2-2$^{th}$ layer.

10. The display apparatus of claim 1, wherein heights of the first portion and the second portion of the dam from a top surface of the substrate are at a same level.

11. The display apparatus of claim 1, further comprising an inner dam between the dam and the display area and spaced apart from the dam,
   wherein a height of the inner dam is equal to or less than a height of the dam.

12. The display apparatus of claim 1, wherein the peripheral area comprises a bending area bent about a bending axis, an inorganic insulating layer in the bending area comprises a groove, and an organic insulating layer is in the groove.

13. A display apparatus comprising:
   a substrate comprising a display area and a peripheral area around the display area;
   a pixel circuit in the display area and a display device connected to the pixel circuit;
   a first organic insulating layer and a second organic insulating layer stacked between the pixel circuit and the display device;
   a wiring between the first organic insulating layer and the second organic insulating layer;
   a pixel-defining film on the second organic insulating layer, and defining an emission area of the display device;
   a thin-film encapsulation layer covering the display device and comprising at least one inorganic film and at least one organic film;
   a first power supply line and a second power supply line in the peripheral area and spaced apart from each other;

a first dam in the peripheral area surrounding the display area; and a second dam surrounding the first dam, the second dam comprising a first portion at least partially overlapping the first power supply line and a second portion at least partially overlapping the second power supply line, wherein the first portion and the second portion of the second dam have different stacked structures from each other.

14. The display apparatus of claim 13, wherein the first portion comprises a 1-1$^{th}$ layer formed of a same material as a material of the first organic insulating layer and a 1-2$^{th}$ layer formed of a same material as a material of the second organic insulating layer.

15. The display apparatus of claim 14, wherein a part of the first power supply line is between the 1-1$^{th}$ layer and the 1-2$^{th}$ layer.

16. The display apparatus of claim 13, wherein the second portion comprises a 2-1$^{th}$ layer that is a lowermost layer and is formed of a same material as a material of the second organic insulating layer.

17. The display apparatus of claim 13, further comprising a detection wiring in the peripheral area of the substrate and clad by the first portion of the second dam.

18. The display apparatus of claim 13, wherein the first portion of the second dam is provided by stacking a 1-1$^{th}$ layer, a 1-2$^{th}$ layer, and a 1-3$^{th}$ layer formed of an organic material, and the second portion is provided by stacking a 2-1$^{th}$ layer and a 2-2$^{th}$ layer, wherein the 1-2$^{th}$ layer and the 2-1$^{th}$ layer are integrally provided.

19. The display apparatus of claim 18, wherein the 1-3$^{th}$ layer and the 2-2$^{th}$ layer are integrally provided, and a thickness of the 2-2$^{th}$ layer is greater than a thickness of the 1-3$^{th}$ layer.

20. The display apparatus of claim 13, wherein the display area has a circular shape.

\* \* \* \* \*